United States Patent
Kishida et al.

(10) Patent No.: US 9,903,891 B2
(45) Date of Patent: Feb. 27, 2018

(54) CAPACITIVE SENSOR

(71) Applicant: HORIBA STEC, CO., LTD., Kyoto (JP)

(72) Inventors: Sotaro Kishida, Kyoto (JP); Ryota Nakayama, Kyoto (JP)

(73) Assignee: HORIBA STEC, CO., LTD., Kyoto (JP)

( * ) Notice: Subject to any disclaimer, the term of this patent is extended or adjusted under 35 U.S.C. 154(b) by 83 days.

(21) Appl. No.: 14/953,113

(22) Filed: Nov. 27, 2015

(65) Prior Publication Data

US 2016/0154030 A1 Jun. 2, 2016

(30) Foreign Application Priority Data

Dec. 2, 2014 (JP) .................................. 2014-244529

(51) Int. Cl.
*G01R 27/26* (2006.01)
*G01R 17/02* (2006.01)
(Continued)

(52) U.S. Cl.
CPC .............. *G01R 17/02* (2013.01); *G01L 1/142* (2013.01); *G01L 1/144* (2013.01); *G01L 9/0072* (2013.01); *G01L 9/12* (2013.01)

(58) Field of Classification Search
CPC ..... G01R 27/2605; G01R 15/16; G06F 3/044; G06F 3/0416; G06F 3/03547; H03K 17/955; H03K 17/962; H03K 2217/960705

(Continued)

(56) References Cited

U.S. PATENT DOCUMENTS 4,550,611 A 11/1985 Czarnocki
4,644,798 A 2/1987 Tamura et al.
(Continued)

FOREIGN PATENT DOCUMENTS

JP 10-111207 4/1998
WO 98/26262 6/1998
WO 2007/122963 11/2007

OTHER PUBLICATIONS

Search Report issued by E.P.O. patent office in E.P.O. Patent Application No. 15003407.2, dated Apr. 20, 2016.

*Primary Examiner* — Giovanni Astacio-Oquendo
(74) *Attorney, Agent, or Firm* — Greenblum & Bernstein, P.L.C.

(57) ABSTRACT

The present invention includes a detecting capacitor of which the capacitance is changed depending on pressure; a fixed capacitor having reference capacitance; an initial voltage application part that applies an initial voltage having a predetermined frequency to the detecting capacitor and the fixed capacitor; a first operational amplifier that outputs an output voltage based on a partial voltage applied to at least the detecting capacitor; a reference voltage generation part that generates a reference voltage that serves as a reference for a change in the output voltage of the first operational amplifier and has the same frequency as that of the initial voltage; a second operational amplifier that outputs an output voltage based on the difference between the output voltage of the first operational amplifier and the reference voltage; and a pressure operation part that operates a pressure from the amplitude of the output voltage of the second operational amplifier.

8 Claims, 3 Drawing Sheets

(51) Int. Cl.
*G01L 1/14* (2006.01)
*G01L 9/00* (2006.01)
*G01L 9/12* (2006.01)

(58) Field of Classification Search
USPC .................................... 324/658, 661, 686
See application file for complete search history.

(56) References Cited

U.S. PATENT DOCUMENTS

| | | | |
|---|---|---|---|
| 4,743,836 A | | 5/1988 | Grzybowski et al. |
| 9,298,303 B2* | | 3/2016 | Wagner ................ G06F 3/0416 |
| 9,817,537 B1* | | 11/2017 | Shakya .................. G06F 3/044 |
| 2004/0210801 A1* | | 10/2004 | Prasad ................ G11C 27/024 |
| | | | 714/700 |
| 2004/0212431 A1* | | 10/2004 | Butler ................ H03F 3/45632 |
| | | | 330/261 |
| 2006/0250267 A1 | | 11/2006 | Umemura et al. |
| 2010/0207795 A1* | | 8/2010 | Waki .................. H03M 1/0658 |
| | | | 341/143 |
| 2011/0298744 A1* | | 12/2011 | Souchkov ............... G06F 3/044 |
| | | | 345/174 |

* cited by examiner

CAPACITIVE SENSOR

TECHNICAL FIELD

The present invention relates to a capacitive sensor adapted to measure a physical quantity, such as a capacitive pressure sensor.

BACKGROUND ART

As illustrated in FIG. 3, a conventional capacitive pressure sensor has: a detecting capacitor formed including a diaphragm, which is deformed when applied with pressure, and a fixed electrode; and a fixed capacitor connected in series with the detecting capacitor, and by applying a square wave voltage to these capacitors, detects a partial voltage applied to the detecting capacitor. By detecting the partial voltage applied to the detecting capacitor as described, a pressure applied to the diaphragm can be measured.

Specifically, the capacitive pressure sensor is configured to detect the partial voltage applied to the detecting capacitor with an operational amplifier (first stage amplifier), synthesize a DC voltage from an output voltage of the first stage amplifier using an inverting and non-inverting circuit (including analog switches), and operate the pressure on the basis of the magnitude of the synthesized DC voltage.

However, a shift in phase or potential occurs in the inverting and non-inverting circuit due to the effect of an environment or a variation in power supply voltage, and consequently a measurement error occurs.

Also, the synthesized DC voltage includes a noise component due to switching of the inverting and non-inverting circuit, and consequently a measurement error occurs.

Further, in the case where the first stage amplifier has an offset error caused by its temperature characteristics, a drift, or the like, the offset error gives rise to a measurement error.

In addition, noise occurring in the first stage amplifier or the inverting and non-inverting circuit directly becomes a noise component, and consequently a measurement error occurs.

Also, as disclosed in Patent Literature 1, there has been considered a capacitive pressure sensor that inputs a partial voltage of a detecting capacitor and a partial voltage of a fixed capacitor (reference capacitor) to an operational amplifier (differential amplifying means).

However, the capacitive pressure sensor is one that outputs an output voltage outputted from the operational amplifier through a bandpass filter and a detector circuit, and how voltage (signal) outputted from the detector circuit is treated is unclear.

CITATION LIST

Patent Literature

Patent Literature 1: JP-A-10-111207

SUMMARY OF INVENTION

Technical Problem

Therefore, the present invention is made in order to solve the above-described problem, and a main intended object thereof is to reduce a measurement error of a capacitive sensor.

Solution to Problem

That is, a capacitive sensor according to the present invention includes: a sensor part of which the capacitance is changed by a change in external force; an initial voltage application part that applies an initial voltage having a predetermined frequency to the sensor part; a first operational amplifier that outputs an output voltage from the sensor part applied with the initial voltage; a reference voltage generation part that serves as a reference for a change in the output voltage of the first operational amplifier and generates a reference voltage having the same frequency as the frequency of the initial voltage; a second operational amplifier that outputs an output voltage based on the difference between the output voltage of the first operational amplifier and the reference voltage; and an external force operation part that operates the external force from the amplitude of the output voltage of the second operational amplifier.

Since the capacitive sensor described above is configured to operate the external force from the amplitude of the difference between the output voltage of the first operational amplifier and the reference voltage serving as a reference for a change in the output voltage, the need for an inverting and non-inverting circuit can be eliminated. This can eliminate a measurement error caused by an inverting and non-inverting circuit. Also, the cost and assembling area of the capacitive sensor can be reduced.

Further, since the capacitive sensor is configured to operate the external force from the amplitude of the difference between the output voltage of the first operational amplifier and the reference voltage, as compared with a conventional method that synthesize a DC voltage, detection sensitivity can be doubled. Still further, a measurement error due to an offset error of the first operational amplifier can be eliminated. In addition, by operating the external force from the amplitude, a noise component included in the output voltage of the second operational amplifier can be reduced to reduce a measurement error.

Desirably, the reference voltage generation part is capable of varying the reference voltage.

In doing so, the reference voltage can be changed corresponding to the characteristics of the sensor part, and an instrumental error of the sensor part can be eliminated.

Possible specific embodiments of the sensor part and the reference voltage generation part include one in which the sensor part is configured to connect in series a detecting capacitor of which the capacitance is changed by the change in the external force and a fixed capacitor having reference capacitance, and the reference voltage generation part is configured to include an impedance element.

This makes it possible to eliminate an instrumental error of the detecting capacitor and an instrumental error of the fixed capacitor by adjusting a resistance value of the impedance element of the reference voltage generation part.

Desirably, the first operational amplifier outputs the output voltage based on a partial voltage of the detecting capacitor at the initial voltage, and the reference voltage generation part is configured to connect a variable impedance element and a fixed impedance element to each other in series, and configured to be applied with the initial voltage and input a voltage at the connecting point between the variable impedance element and the fixed impedance element to the second operational amplifier as the reference voltage.

In this configuration, since the initial voltage is applied to the series-connected variable impedance element and fixed impedance element, and the voltage at the connecting point between these impedance elements is used as the reference voltage, the frequency of the reference voltage and the frequency of the initial voltage can be made completely equal to each other. Also, by adjusting the variable impedance element correspondingly to the partial voltage of the detecting capacitor, an instrumental error of the capacitive sensor can be eliminated.

Desirably, by adjusting a resistance value of the variable impedance element, the reference voltage is adjusted to have the same amplitude as that of an output voltage of the first operational amplifier under a predetermined pressure.

In doing so, an output voltage of the second operational amplifier under the predetermined pressure can be made equal to 0 V, making it easy to select an AD converter having a desired resolution.

In particular, it is desirable that by adjusting a resistance value of the variable impedance element, the reference voltage is adjusted to have the same amplitude as that of an output voltage of the first operational amplifier under an intermediate pressure in a desired measurement range.

As described, by making the adjustment to achieve the same amplitude as that of the output voltage of the first operational amplifier under the intermediate pressure in the measurement range, measurement errors at the minimum and maximum values in the measurement range can be reduced.

Advantageous Effects of Invention

As described, since the present invention is configured to operate the external force from the amplitude of the difference between the output voltage of the first operational amplifier and the reference voltage serving as a reference for a change in the output voltage, a measurement error of the capacitive sensor can be reduced.

DESCRIPTION OF EMBODIMENTS

Figure 1:
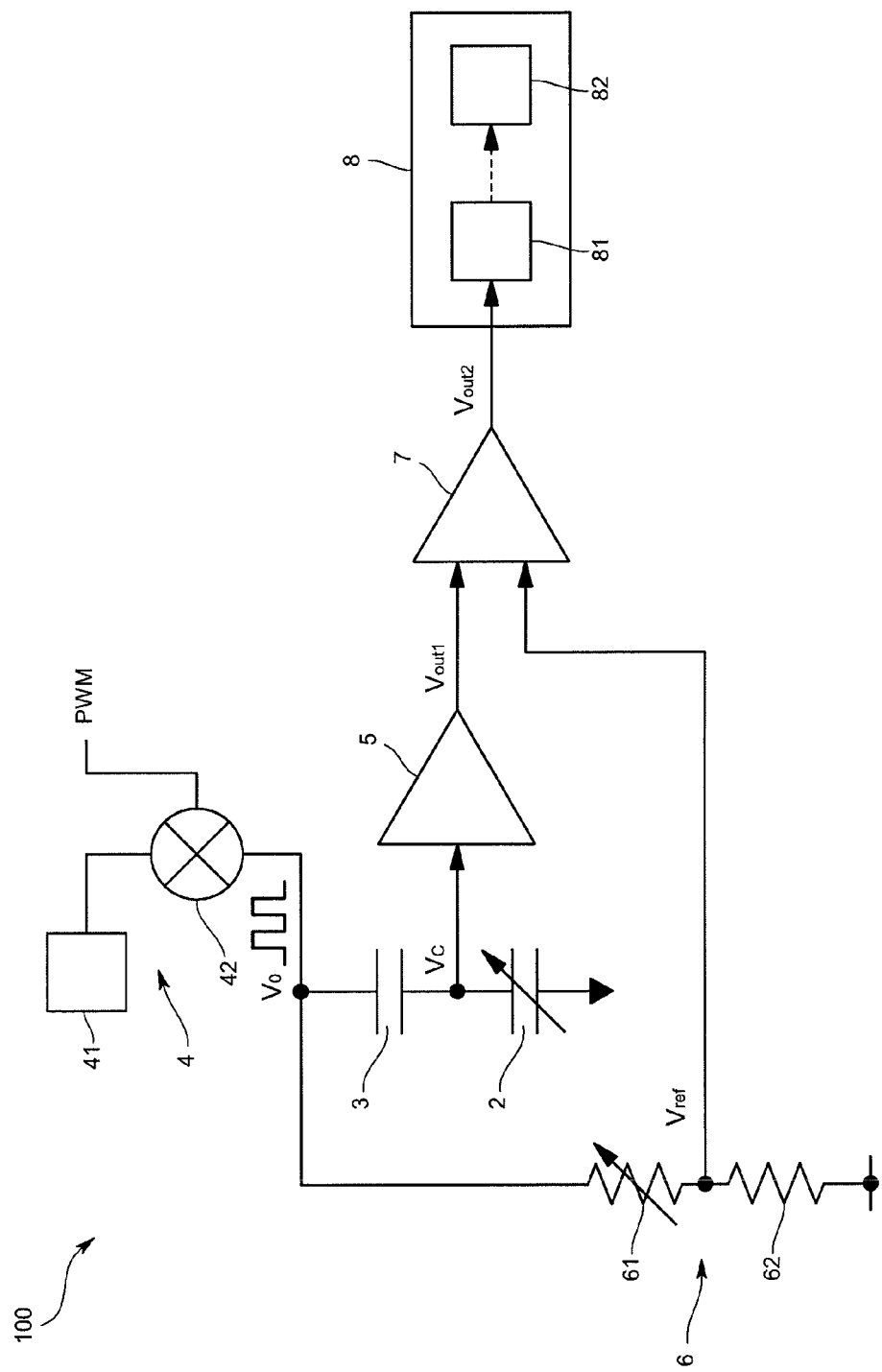
FIG. 1 a schematic diagram illustrating the circuit configuration of a capacitive pressure sensor in the present embodiment.

In the following, one embodiment of a capacitive pressure sensor according to the present invention will be described with reference to the drawings.

A capacitive pressure sensor 100 in the present embodiment includes: a detecting capacitor 2 of which the capacitance is changed when applied with pressure; a fixed capacitor 3 having reference capacitance; an initial voltage application part 4 adapted to apply an initial voltage $V_0$ having a predetermined frequency to the detecting capacitor 2 and the fixed capacitor 3; a first operational amplifier 5 adapted to output an output voltage $V_{out1}$ based on at least a partial pressure $V_c$ applied to the detecting capacitor 3; a reference voltage generation part 6 adapted to generate a reference voltage $V_{ref}$ that serves as a reference for a change in the output voltage $V_{out1}$ of the first operational amplifier 5 and has the same frequency as that of the initial voltage $V_0$; a second operational amplifier 7 adapted to output an output voltage $V_{out2}$ based on the difference between the output voltage $V_{out1}$ of the first operational amplifier 5 and the reference voltage $V_{ref}$; and a pressure operation part 8 adapted to operate a pressure from the amplitude of the output voltage $V_{out2}$ of the second operational amplifier 7.

In the following, the respective parts 2 to 8 will be described in detail. The detecting capacitor 2 is formed including: a diaphragm that is deformed when applied with pressure; and a fixed electrode that is provided opposite to the diaphragm. The opposite surface of the diaphragm to the fixed electrode, and the opposite surface of the fixed electrode to the diaphragm are both flat surfaces. Also, the deformation of the diaphragm by pressure changes the distance between the opposite surfaces, and thereby the capacitance of the detecting capacitor is changed.

The fixed capacitor 3 is one that has fixed capacitance that does not change regardless of pressure applied to the detecting capacitor 2. The fixed capacitor 3 is connected in series with the detecting capacitor 2 to constitute a sensor part.

In addition, one terminal (e.g., on the diaphragm side) of the detecting capacitor 2 of the series-connected detecting capacitor 2 and fixed capacitor 3, is connected to the common (grounded).

The initial voltage application part 4 is one that generates the initial voltage $V_0$ of a square wave having the predetermined frequency, and has: a referring voltage generation part 41 adapted to generate a constant DC voltage (e.g., a DC voltage of 2.5 V), such as a reference IC; and a reference voltage generation part 42 adapted to convert the DC voltage obtained by the referring voltage generation part 41 to the reference voltage $V_0$ having the predetermined frequency (e.g., 25 kHz) using an externally inputted predetermined PWM signal. The initial voltage application part 4 applies the reference voltage $V_0$ to one terminal of the fixed capacitor 3 of the series-connected detecting capacitor 2 and fixed capacitor 3. In addition, the other terminal of the fixed capacitor 3 is connected to the other terminal (on the fixed electrode side) of the detecting capacitor 2.

The first operational amplifier 5 is one that is inputted with the partial voltage $V_c$, which is applied to the detecting capacitor 2 when the initial voltage $V_0$ is applied, and outputs the output voltage $V_{out1}$ based on the partial voltage $V_c$.

The reference voltage generation part 6 has a variable resistor (variable impedance element) 61 and a fixed resistor (fixed impedance element) 62, which are connected to each other in series. One terminal of the variable resistor 61 is connected to the common. Also, one terminal of the fixed resistor 62 is applied with the initial voltage $V_0$ from the initial voltage application part 4. It is further configured that the other terminal of the variable resistor 62 is connected to the other terminal of the fixed resistor 62, and a voltage at the connecting point between them is inputted to the second operational amplifier 7.

That is, the mutually series-connected detecting capacitor 2 and fixed capacitor 3 and the mutually series-connected variable resistor 61 and fixed resistor 62 are applied with the initial voltage $V_0$ that is common thereto.

In doing so, from the connecting point between the variable resistor 61 and the fixed resistor 62, the reference voltage $V_{ref}$ having the same frequency as that of the initial voltage $V_0$ is inputted to the second operational amplifier 7. Note that the reference voltage $V_{ref}$ in the present embodiment is a partial voltage that is applied to the fixed resistor 62 when the initial voltage $V_0$ is applied.

In the present embodiment, by adjusting a resistance value of the variable resistor 61, the reference voltage $V_{ref}$ is adjusted so as to have the same amplitude as that of the output voltage $V_{out1}$ of the first operational amplifier 5 when the diaphragm is applied with a predetermined pressure. Specifically, by adjusting the resistance value of the variable resistor 61, the reference voltage $V_{ref}$ is adjusted to have the same amplitude as that of the output voltage $V_{out1}$ of the first operational amplifier 5 at an intermediate value in a desired measurement range.

The second operational amplifier 7 is one that outputs the output voltage $V_{out2}$ resulting from amplifying the difference between the output voltage $V_{out1}$ of the first operational amplifier 5 and the reference voltage $V_{ref}$ with a predetermined gain (amplification factor). Note that the gain of the second operational amplifier 7 has a value determined by, for example, a measurement range and the below-described input voltage range of an AD converter 81 of the pressure operation part 8.

Figure 2:
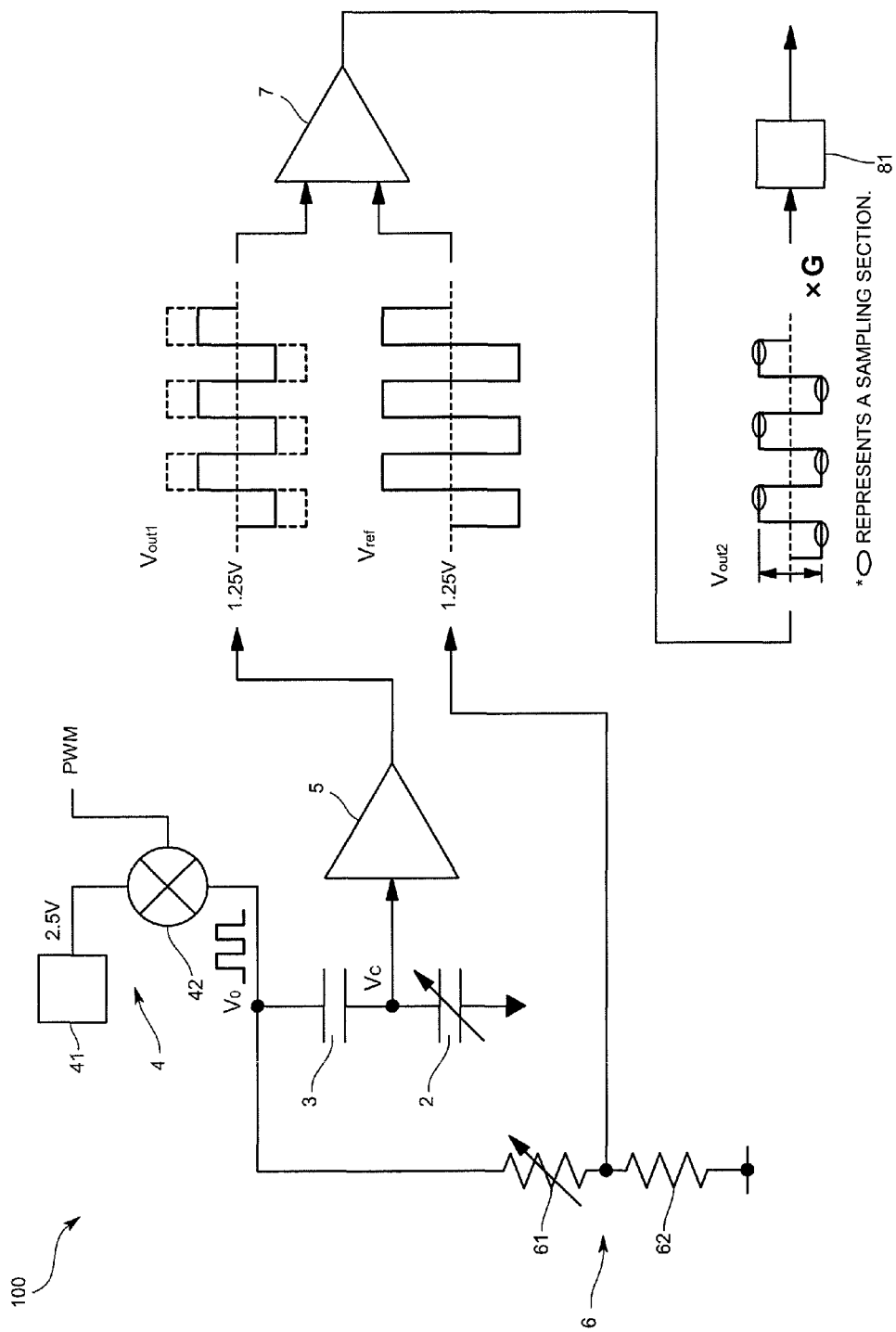
FIG. 2 is a schematic diagram illustrating voltages of respective parts in the same embodiment.
Figure 3:
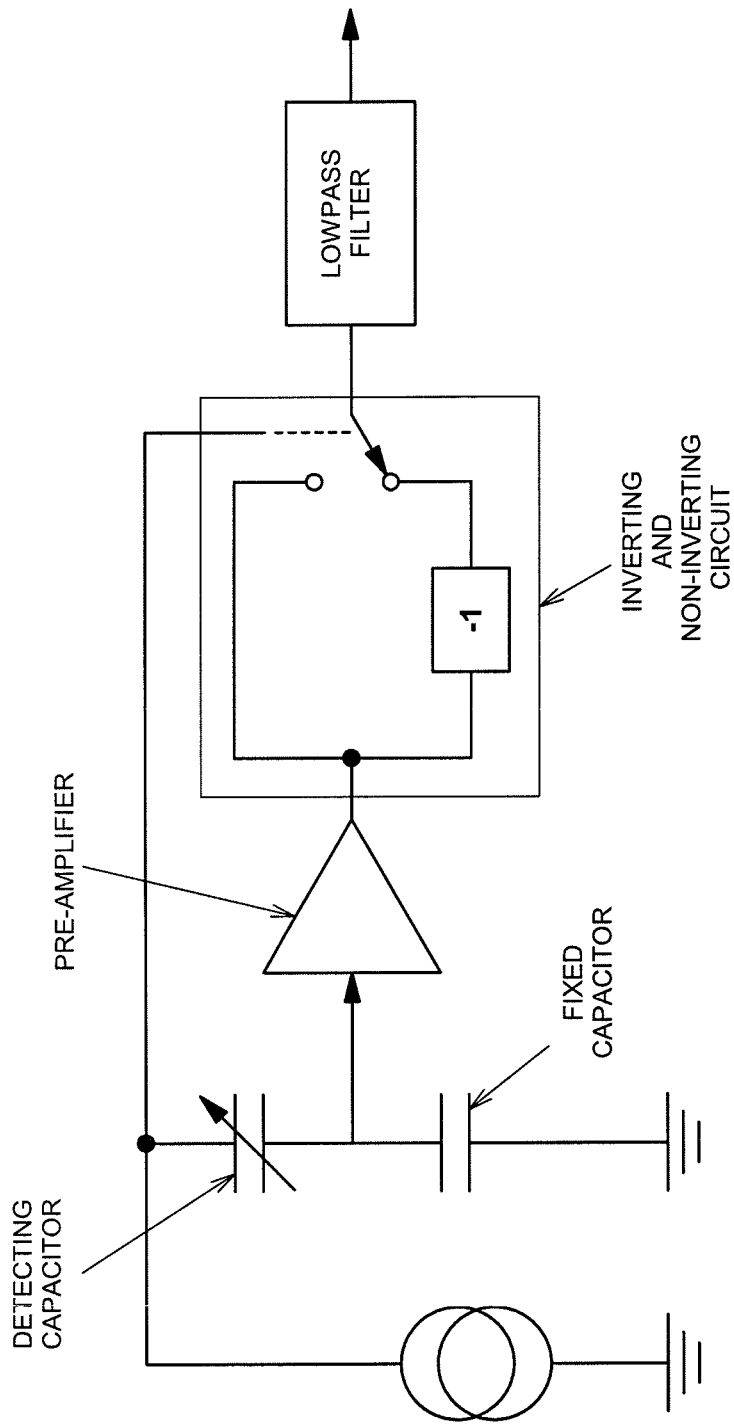
FIG. 3 is a schematic diagram illustrating the circuit configuration of a conventional capacitive pressure sensor.

The pressure operation part 8 has: the AD converter 81 adapted to AD-convert the output voltage $V_{out2}$ of the second operational amplifier 7; and a pressure conversion part 82 adapted to operate the amplitude of the output voltage $V_{out2}$ from a digital signal outputted from the AD converter 81 as well as operating a pressure from the amplitude. Note that the AD converter 81 of the pressure operation part 8 samples the output voltage $V_{out2}$ while avoiding ringing parts immediately after the rise and fall of the output voltage $V_{out2}$ of the second operational amplifier 7 (see a square wave of the output voltage $V_{out2}$ in FIG. 2). Specifically, the AD converter 81 extracts the output voltage $V_{out2}$ from plus and minus side stable parts of the square wave output voltage $V_{out2}$ of the second operational amplifier 7 after the end of the ringing on the basis of the sample-and-hold action, and converts it to the digital signal.

The pressure conversion part 82 stores amplitude-pressure-related data or calibration curve data indicating the relationship between the amplitude indicated by the digital signal outputted from the AD converter 81 and the pressure, and on the basis of the amplitude-pressure-related data or the calibration curve data, operates the pressure.

Since the capacitive pressure sensor 100 in the present embodiment is configured to operate the pressure on the basis of the amplitude of the difference between the output voltage $V_{out1}$ of the first operational amplifier 5 and the reference voltage $V_{ref}$ serving as a reference for a change in the output voltage $V_{out1}$, the need for an inverting and non-inverting circuit can be eliminated. This can eliminate a measurement error due to an inverting and non-inverting circuit. Also, the cost and assembling area of the capacitive pressure sensor 100 can be reduced.

Further, since the capacitive pressure sensor is configured to operate the pressure from the amplitude of the difference between the output voltage $V_{out1}$ of the first operational amplifier 5 and the reference voltage $V_{ref}$, detection sensitivity can be doubled as compared with a conventional method that synthesizes a DC voltage. Also, a measurement error due to an offset error of the first operational amplifier 5 can be eliminated. Further, since the pressure is operated from the amplitude, a noise component included in the output voltage $V_{out2}$ of the second operational amplifier 7 can be reduced to reduce a measurement error. Still further, since the reference voltage $V_0$ is a voltage having a high frequency such as 20 kHz, low frequency noise occurring due to an external disturbance can be eliminated.

In addition, by adjusting the resistance value of the variable resistor 61 of the reference voltage generation part 6 and thereby generating the reference voltage $V_{ref}$ so as to correspond to the characteristics of the set of the detecting capacitor 2 and the fixed capacitor 3, an instrumental error of the detecting capacitor 2 and an instrumental error of the fixed capacitor 3 can be eliminated.

Also, according to the present embodiment, since the series-connected variable resistor 61 and fixed resistor 62 is applied with the initial voltage $V_0$, and the voltage at the connecting point between them is used as the reference voltage $V_{ref}$, the frequency of the reference voltage $V_{ref}$ and the frequency of the initial voltage $V_0$ can be made completely equal to each other. Further, by adjusting the variable resistor 61 so as to correspond to the partial voltage of the detecting capacitor 2, an instrumental error of the capacitive pressure sensor 100 can be eliminated.

Since the reference voltage $V_{ref}$ is adjusted to have the same amplitude as that of the output voltage $V_{out1}$ of the first operational amplifier 5 under the predetermined pressure by adjusting the resistance value of the variable resistor 61, the output voltage $V_{out2}$ of the second operational amplifier 7 under the predetermined pressure can be made equal to 0 V, making it easy to select an AD converter having a desired resolution.

In particular, since the reference voltage $V_{ref}$ is adjusted to have the same amplitude as that of the output voltage $V_{out1}$ of the first operational amplifier 5 under an intermediate pressure in a desired measurement range, measurement errors at the minimum and maximum values in the measurement range can be reduced.

Note that the present invention is not limited to the above-described embodiment.

For example, the reference voltage generation part may be, without limitation to the configuration in the above-described embodiment, configured to preliminarily obtain a reference voltage having the same frequency and the same amplitude as those of an output voltage of the first operational amplifier under a predetermined external force, has a reference voltage data storage part adapted to store reference voltage data indicating the reference voltage, and from the reference voltage data storage part, output the reference voltage in synchronization with the output voltage of the first operational amplifier.

Also, in the above-described embodiment, the reference voltage is adjusted to have the same amplitude as that of the output voltage of the first operational amplifier at the intermediate value in the desired measurement range, but may have the minimum or maximum value in the measurement range, or a value between the minimum and maximum values.

Further, the configuration of the reference voltage generation part is not limited to the mutually series-connected variable resistor and fixed resistor, but may be a mutually series-connected variable resistor and fixed capacitor. Still further, as the variable impedance element and the fixed impedance element constituting the reference voltage generation part, in addition to the resistors, coils or capacitors are also possible.

In addition, the above-described embodiment is configured to connect the detecting capacitor and the fixed capacitor in series as well as connecting the variable resistor and the fixed resistor in series, and apply the initial voltage to them, but may be configured to connect the detecting capacitor and the fixed resistor in series as well as connecting the fixed capacitor and the variable resistor in series, and apply the initial voltage to them.

Besides, needless to say, the present invention is not limited to any of the above-described embodiments, but can be variously modified without departing from the scope thereof.

REFERENCE SIGNS LIST

100: Capacitive pressure sensor
2: Detecting capacitor

3: Fixed capacitor
4: Initial voltage application part
5: First operational amplifier
6: Reference voltage generation part
61: Variable resistor (variable impedance element)
62: Fixed capacitor (fixed impedance element)
7: Second operational amplifier
8: Pressure operation part (external force operation part)

The invention claimed is:

1. A capacitive sensor comprising:
   at least one capacitor of which capacitance is changed by a change in external force;
   an initial voltage applier comprising an integrated circuit that applies an initial voltage having a predetermined frequency to the at least one capacitor;
   a first operational amplifier that outputs an output voltage from the at least one capacitor applied with the initial voltage;
   at least one impedance element that serves as a reference for a change in the output voltage of the first operational amplifier and generates a reference voltage having a same frequency as the frequency of the initial voltage;
   a second operational amplifier that outputs an output voltage based on a difference between the output voltage of the first operational amplifier and the reference voltage; and
   a pressure controller having an analog-to-digital converter and storage, wherein the pressure controller operates the pressure based upon an external force from amplitude of the output voltage of the second operational amplifier.

2. The capacitive sensor according to claim 1, wherein the at least one impedance element is capable of varying the reference voltage.

3. The capacitive sensor according to claim 1, wherein the at least one capacitor comprises a detecting capacitor of which capacitance is changed by the change in the external force and a fixed capacitor having reference capacitance, wherein the detecting capacitor and the fixed capacitor are connected in series.

4. The capacitive sensor according to claim 3, wherein
   the first operational amplifier outputs the output voltage based on a partial voltage of the detecting capacitor at the initial voltage, and
   wherein the at least one impedance element comprises a variable impedance element and a fixed impedance element connected to each other in series and is configured to be applied with the initial voltage and input a voltage at a connecting point between the variable impedance element and the fixed impedance element into the second operational amplifier as the reference voltage.

5. The capacitive sensor according to claim 4, wherein
   by adjusting a resistance value of the variable impedance element, the reference voltage is adjusted to have same amplitude as that of an output voltage of the first operational amplifier under a predetermined external force.

6. The capacitive sensor according to claim 4, wherein
   by adjusting a resistance value of the variable impedance element, the reference voltage is adjusted to have same amplitude as that of an output voltage of the first operational amplifier at an intermediate value in a desired measurement range.

7. The capacitive sensor according to claim 1, wherein
   the analog-to-digital converter samples the output voltage while avoiding ringing parts immediately after a rise and a fall of the output voltage of the second operational amplifier.

8. The capacitive sensor according to claim 1, wherein
   the storage stores amplitude-pressure-related data or calibration curve data that indicates a relationship between the amplitude indicated by a digital signal outputted from the analog-to-digital converter and the pressure, and wherein
   the pressure controller operates the pressure based on the amplitude-pressure-related data or the calibration curve data.

* * * * *